United States Patent [19]

Bjorksten et al.

[11] Patent Number: 5,896,046
[45] Date of Patent: Apr. 20, 1999

[54] LATCH STRUCTURE FOR RIPPLE DOMINO LOGIC

[75] Inventors: Andrew Augustus Bjorksten, Austin; Michael Kevin Ciraula, Round Rock; Christopher McCall Durham; Donald George Mikan, Jr., both of Austin, all of Tex.

[73] Assignee: International Business Machines Corporation, Armonk, N.Y.

[21] Appl. No.: 08/790,259

[22] Filed: Jan. 27, 1997

[51] Int. Cl.⁶ .................................................. H03K 19/096
[52] U.S. Cl. ............................. 326/98; 326/121; 326/96
[58] Field of Search ............................ 326/93, 95, 98, 326/119, 121, 97, 96; 327/408, 407

[56] References Cited

U.S. PATENT DOCUMENTS

| | | | |
|---|---|---|---|
| 4,896,057 | 1/1990 | Yang et al. | 307/448 |
| 5,015,890 | 5/1991 | Murakami et al. | 326/121 |
| 5,041,742 | 8/1991 | Carbonaro | 307/452 |
| 5,121,003 | 6/1992 | Williams | 307/452 |
| 5,173,626 | 12/1992 | Kudou et al. | 326/97 |
| 5,262,994 | 11/1993 | McClure | 326/106 |
| 5,414,714 | 5/1995 | Gladden et al. | 371/22.3 |
| 5,453,708 | 9/1995 | Gupta et al. | 326/98 |
| 5,513,132 | 4/1996 | Williams | 364/715.01 |
| 5,517,136 | 5/1996 | Harris et al. | 326/93 |
| 5,530,659 | 6/1996 | Anderson et al. | 326/95 |
| 5,543,731 | 8/1996 | Sigal et al. | 326/40 |
| 5,576,651 | 11/1996 | Phillips | 327/202 |
| 5,617,428 | 4/1997 | Andoh | 371/22.3 |
| 5,646,557 | 7/1997 | Runyon et al. | 326/96 |
| 5,767,717 | 6/1998 | Schorn et al. | 327/210 |

*Primary Examiner*—Jon Santamauro
*Assistant Examiner*—Don Phu Le
*Attorney, Agent, or Firm*—Anthony V. S. England

[57] ABSTRACT

A method and implementing structure for a domino block circuit 200 includes a minimal component latching circuit 203 which is merged with an exemplary MUX functional block 201, to provide both inverting and latching functions with minimal propagation delay in the domino data path. Implementations with scanning circuitry and including a holding feature are also illustrated.

7 Claims, 4 Drawing Sheets

LATCH STRUCTURE FOR RIPPLE DOMINO LOGIC

FIELD OF THE INVENTION

The present invention relates generally to digital logic signal processing and more particularly to a latching circuit structure for use in ripple domino logic circuits.

BACKGROUND OF THE INVENTION

In general, the term "domino logic" is used to refer to an arrangement of logic circuit stages which may, for example, be cascaded together in an integrated circuit array configuration. A signal may be inputted to a first stage where it is evaluated in order to provide an output signal to a second stage where that output signal is again evaluated to provide an output signal for propagation to and evaluation by yet another stage in the circuit. Thus a "domino" effect is achieved whereby signals are sequentially propagated through an array of "stages" or "domino blocks", and each successive stage performs an evaluation of an input condition until a final output is provided at a final output stage.

Domino logic circuits may be arranged so that signals can propagate through the various stages without being separately clocked at each stage. Accordingly, a domino arrangement allows a signal to be processed through a relatively complex logic function during a single clock cycle. That ability of a domino circuit obviates the need for plural clock cycles to process the input signals, and also decreases the overall processing time of the logic function.

Perhaps the biggest disadvantage to domino logic is that it is not a complete logic family, i.e. it is not possible to construct all logic functions using only domino circuits or blocks. The problem is that domino logic does not admit any inverting stages. Attempts to avoid this "inversion" problem by adding inverting stages to ordinary domino logic introduces signal race conditions which would not be present in a pure domino logic configuration. The term "race condition" characterizes a timing relation between two signals that must be met for the circuit to function correctly and reliably, and this race condition is not relaxed by slowing the clock frequency.

In the past, efforts have been made to overcome the inversion problem, but such efforts have not been totally successful. For example, where the clock signal to the domino logic block is delayed in order to prevent the domino block from evaluating until the negative input to the block has stabilized. However, if the delay introduced in the clock is not large enough, a race condition is introduced and the circuit will fail to function properly and reliably, and any extra delay of the clock which may be applied as a safety margin, also slows the evaluation function of the circuit by an equal amount.

In some domino circuits, various latching circuits have been implemented in an effort to latch and thereby isolate the domino output or stage output signal in order to avoid corrupting the output signal when the domino stage is precharging in preparation for receiving the next input signal for processing by the domino circuit. However in those designs, care must be taken to insure that the isolation of the output signal does not come at too high of a cost in terms of added gate delays and the resulting introduced added propagation delay time for the domino circuit.

Thus there is a need to provide an improved method and apparatus for the implementation of a domino logic circuit which combines a latch function within a domino block and does not introduce unacceptable or more than minimal added delays due to additional stages which may otherwise adversely affect the speed, timing or reliability of the ripple domino logic circuitry.

SUMMARY OF THE INVENTION

A method and apparatus is provided for designing and implementing a domino circuit which includes an inherent latching function within the domino circuit itself thereby obviating the need for and delay of a separate latching block in addition to the domino logic block.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION OF A PREFERRED EMBODIMENT OF THE INVENTION

Although the present disclosure shows isolated domino circuitry for the sake of simplicity, it is understood that the present invention is not limited to isolated logic implementations or logic array implementations but rather also includes systems in which the methodology taught herein is implemented within or as part of a single system CPU or other larger semiconductor system, chip, processor or integrated circuit.

Figure 1:
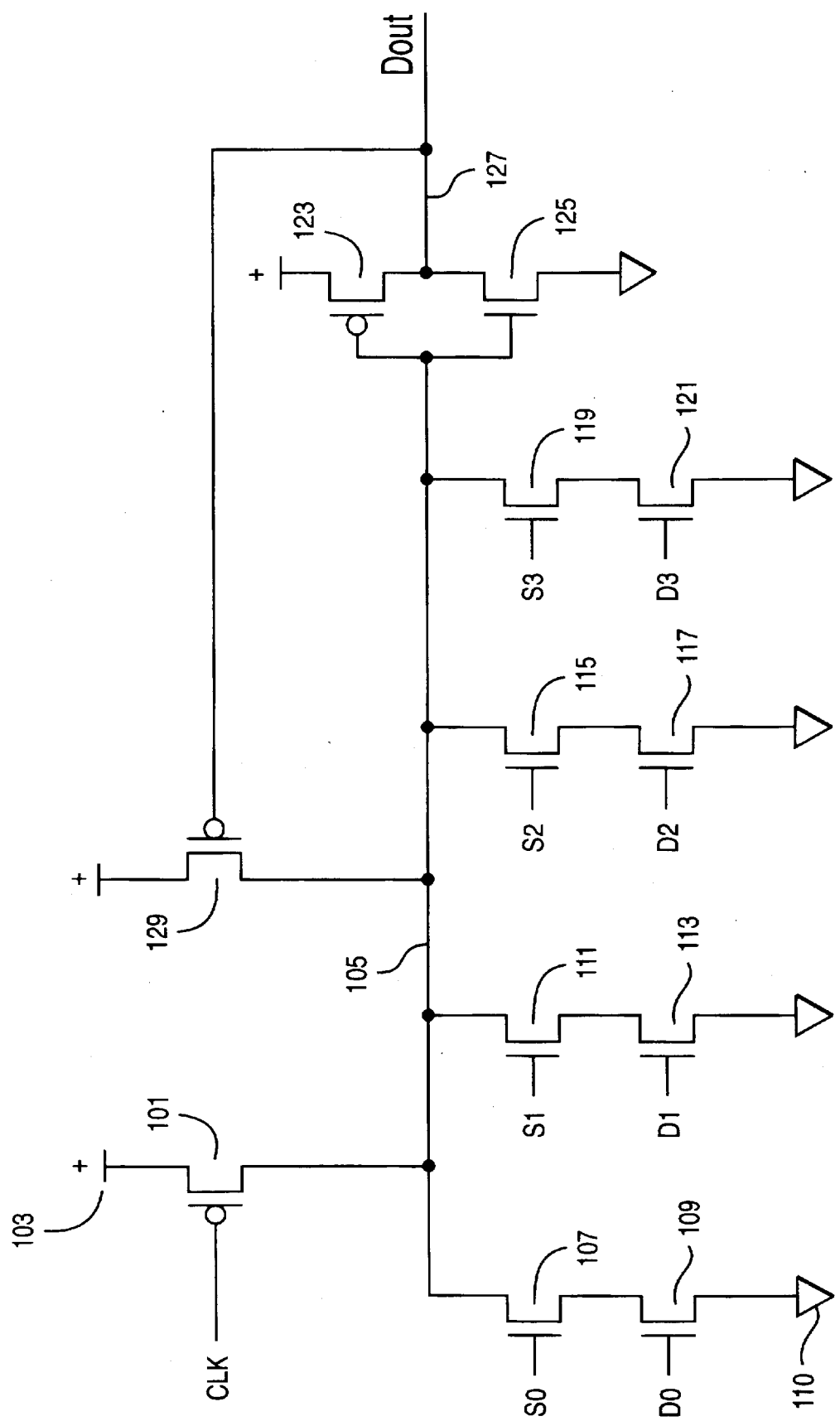
FIG. 1 is a circuit diagram of a 4:1 domino MUX circuit.

With reference to FIG. 1, a domino MUX circuit includes a plurality of four data input terminals designated D0 through D3, respectively, and a similar plurality of input data selection terminals designated S0 through S3, respectively. The FIG. 1 MUX circuit receives a clock signal CLK and provides an out signal Dout representative of the selected input signal. The first selection signal S0 and first data input signal D0 are applied to the gate terminals of corresponding n-channel transistors 107 and 109, respectively. Transistors 107 and 109 are connected in series between a MUX node 105 and a logic "0" potential 110. A p-channel transistor 101 is connected between the MUX node 105 a logic "1" level potential. A gate terminal of the transistor 101 is arranged to receive a clock signal CLK.

In the present example, the terms "source" or "source potential" are used interchangeably to refer to a logic "1" or "high" level potential. Also the terms "zero level", "ground potential", or "ground" are also used interchangeably to refer to a logic "0" or "low" level potential. The logic "1" level and logic "0" level symbols shown in the drawings shall be hereinafter referred to as such although such symbols are not necessarily hereinafter numbered in the drawings in order to avoid obfuscating the other components of the drawings.

In a similar manner, the MUX node 105 is connected to the logic "0" level potential through a second set of series connected transistors 111 and 113 which receive S1 and D1 inputs to their gate terminals, respectively. MUX node 105 is also connected to the logic "0" level potential through a third set of series connected transistors 115 and 117 which receive S2 and D2 inputs to their gate terminals, respectively. Further, since the present example illustrates a four input MUX circuit, MUX node 105 is also connected to the logic "0" level potential through a fourth set of series connected transistors 119 and 121 which receive S3 and D3 inputs to their gate terminals, respectively. The MUX node 105 is also connected to a common point connecting the gate terminals of a p-channel transistor 123 and an n-channel transistor 125. Transistors 123 and 125 are connected in series between the logic "1" level bus and the logic "0" level bus. A common point 127 between the series connected transistors 123 and 125 provides a MUX output signal Dout and is also coupled back to the gate terminal of a p-channel transistor 129 which is connected between the "1" logic level and the MUX node 105.

In operation, FIG. 1 illustrates a MUX domino circuit which includes a four input selection scheme. Each of four input paths includes a pair of transistors for selectively choosing one of the inputs D0–D3 and processing the selected input for presentation at output node 127 as the MUX output Dout. Each input includes series connected transistors such that in order for one of the inputs D0–D3 to be selected, its associated select signal S0–S3 must be of a predetermined logic level at the proper time relative to the clocking scheme and the clock signal CLK for the MUX circuit. For example, if S0 and D0 are both at a logic 1 or high logic level, the domino circuit is said to be "evaluating", and transistors 107 and 109 will conduct and bring the MUX node 105 to the logic 0 level. If the node 105 is at a low logic level, the inverter including transistors 123 and 125 will invert the signal to provide a high logic level at the MUX output node 127. The inverter circuitry is used in FIG. 1 in order to provide an inverting function and maintain the positive logic integrity of the illustrated domino block with respect to other neighboring domino blocks in an array. In order to provide additional output signal buffering or isolation, a latching circuit may be included at the MUX output node 127, but the inclusion of a latch would also create an additional signal propagation delay which may render the MUX timing unacceptable for most applications. In the present example including FIGS. 1–5, a MUX circuit has been used to demonstrate the domino circuit timing considerations although it is understood that the present discussion also applies to any other domino configured block or domino logic function segment for implementing logic and other processing functions within a domino logic design environment.

Figure 2:
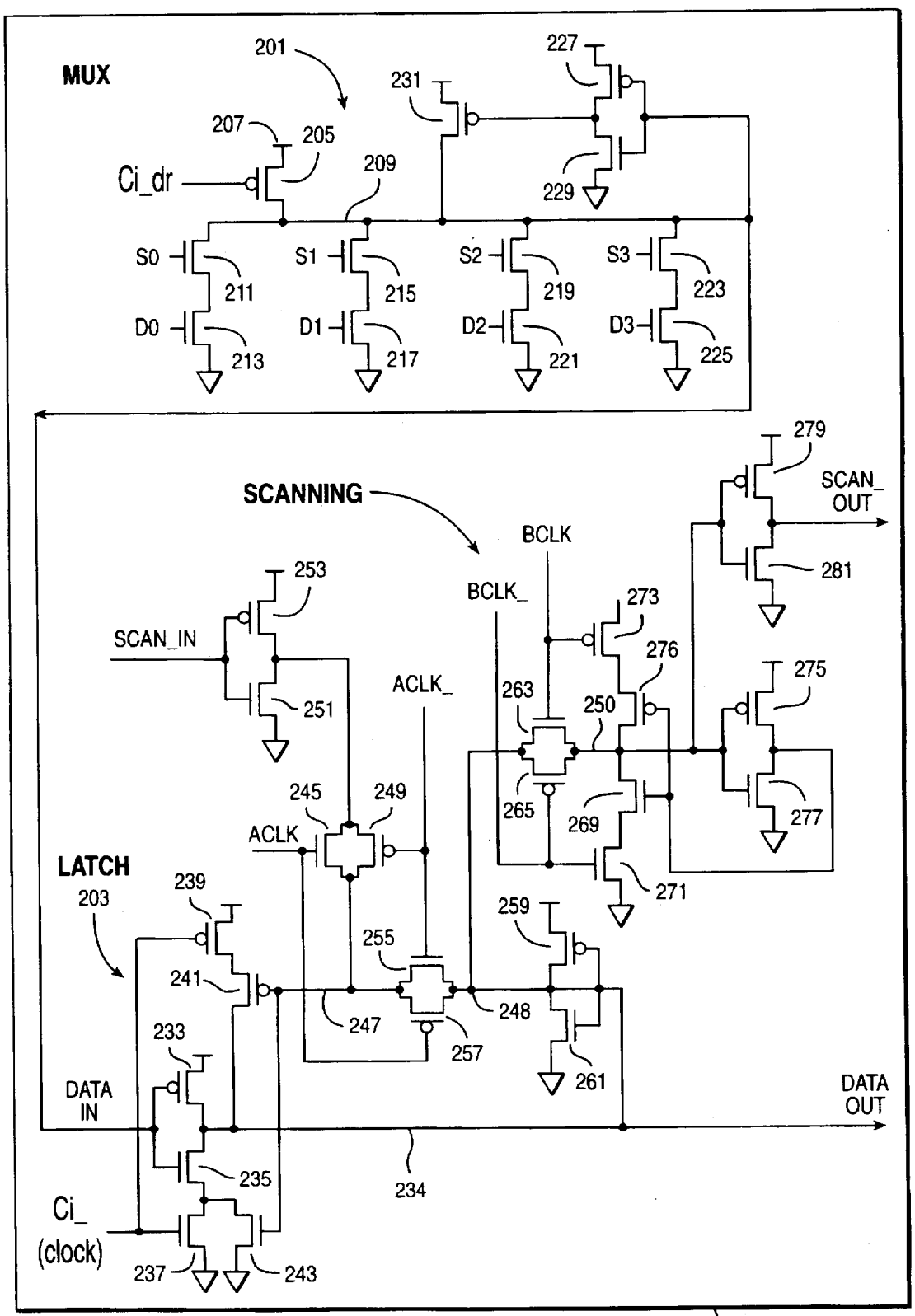
FIG. 2 is a circuit diagram of a 4:1 MUX circuit merged with a latch circuit.

In FIG. 2, a MUX-LATCH combination domino circuit 200 is shown which includes a MUX circuit segment 201 and a latch circuit 203 which further includes a latch circuit segment therein. Both circuits 201 and 203 may be merged together as one domino type block 200 thereby including an inverting function and a latch function within a domino block and adding only a minimal delay to the functional processing of the combination domino circuit. The MUX circuit 201 in FIG. 2 is similar to the MUX circuit shown in FIG. 1 except that the output of the circuit is taken from different points in the circuit. In FIG. 2 the inverter circuitry is removed from the data path such that the MUX node is connected directly to the latch circuit 203 which now provides the latching function and the inverting function for then MUX domino block 200. The FIG. 2 MUX circuit receives a clock signal Ci_dr and provides an output signal (representative of the selected input signal to the MUX) as an input to the latch circuit 203. The first selection signal S0 and first data input signal D0 are applied to the gate terminals of corresponding n-channel transistors 211 and 213, respectively. Transistors 211 and 213 are connected in series between a MUX node 209 and a logic "0" potential. A p-channel transistor 205 is connected between the MUX node 209 and a logic "1" level potential. A gate terminal of the transistor 205 is arranged to receive a clock signal Ci_dr.

The MUX node 209 is connected to the logic "0" level potential through a second set of series connected transistors 215 and 217 which receive S1 and D1 inputs to their gate terminals, respectively. MUX node 209 is also connected to the logic "0" level potential through a third set of series connected transistors 219 and 221 which receive S2 and D2 inputs to their gate terminals, respectively. Further, since the FIG. 2 example illustrates a four input MUX circuit, MUX node 209 is also connected to the logic "0" level potential through a fourth set of series connected transistors 223 and 225 which receive S3 and D3 inputs to their gate terminals, respectively. The MUX node 209 is also connected to a common point connecting the gate terminals of a p-channel transistor 227 and an n-channel transistor 229. Transistors 227 and 229 are connected in series between the logic "1" level bus and the logic "0" level bus. A common point between the series connected transistors 227 and 229 is coupled back to the gate terminal of a p-channel transistor 231 which is connected between the "1" logic level and the MUX node 209. In the FIG. 2 example, MUX node 209 provides an output signal which is applied as "DATA IN" to the latch portion 203 of the combined MUX-LATCH domino circuit 200.

The DATA IN signal is applied to the latch circuit at a common point connecting the gate terminals of a p-channel transistor 233 and an n-channel transistor 235. One output terminal of transistor 233 is connected to the logic "1" level potential. The other output terminal of transistor 233 is connected to a latch output node 234. Node 234 is also connected through n-channel transistors 235 and 237 to ground or the "0" logic level. Transistor 237 is arranged to receive a clock signal Ci. Two p-channel transistors 239 and 241 are serially connected between the source node 234, respectively. The gate terminal of transistor 239 is connected to the gate terminal of transistor 237 which is arranged to receive the clock signal Ci. An n-channel transistor 243 is connected between a common point between transistors 235 and 237 and the ground potential. The gate terminal of transistor 243 is connected to the gate terminal of transistor 241. The gate terminal of transistor 241 is connected to a common node 247.

P-channel transistor 253 and n-channel transistor are serially connected between the logic "1" level potential and ground or logic "0" level potential. The gate terminals of transistors 251 and 253 are connected together and arranged to receive a SCAN_IN input signal. N-channel transistor 245 and p-channel transistor 249 are connected in parallel between a common point connecting series connected transistors 251 and 251, and the common node 247. The gate terminal of transistor 245 is arranged to receive a clock signal ACLK. The gate terminal of transistor 249 is arranged to also receive clock signal ACLK. The gate terminal of transistor 249 is also connected to the gate terminal of an n-channel transistor 255 which is connected in parallel across p-channel transistor 257. The gate terminal of transistor 257 is connected to the gate terminal of transistor 245 and is arranged to receive the clock signal ACLK. Transistors 255 and 257 are connected in parallel between the first common node 247 and a second common node 248.

P-channel transistor 259 and n-channel transistor 261 are connected between the logic 1 and logic 0 potentials. The common point between the output terminals of transistors 259 and 261 is connected to the second common node 248. The gate terminals of transistors 259 and 261 are connected together and to the output node or DATA OUT node 234. N-channel transistor 263 and p-channel transistor 265 are connected in parallel between the second common node 248 and a third common node 250. Common node 250 is connected to ground through series connected n-channel transistors 269 and 271. The gate terminal of transistor 271 is connected to the gate terminal of transistor 265 and both terminals are arranged to receive a clock signal BCLK. The gate terminal of transistor 263 is also arranged to receive the clock signal BCLK. P-channel transistors 267 and 273 are connected in series between the logic 1 level potential and the third common node 250. The gate terminal of transistor 273 is connected to the gate terminal of transistor 263 and is also arranged to receive the clock signal BCLK.

P-channel transistor 275 and n-channel transistor 277 are connected in series between the logic 1 and logic 0 potentials. The gate terminals of transistors 275 and 277 are connected together and to the third common node 250. The common point between the output terminals of transistors 275 and 277 is connected back to the gate terminals of transistors 267 and 269. P-channel transistor 279 and n-channel transistor 281 are serially connected between the logic 1 and logic 0 voltage levels. The gate terminals of transistors 279 and 281 are connected together and to the third common node 250. The common point between the output terminals of transistors 279 and 281 is arranged to provide an output signal SCAN_OUT.

In operation, the inverter including transistors 123 and 125 of the FIG. 1 configuration has been removed from the MUX configuration shown in FIG. 2 and the MUX node is connected directly to a new latching configuration or latch circuit segment including only eight latching circuit transistors 233, 235, 237, 239, 241, 243, 259 and 261. The illustrated design, including only eight transistors for the latch, represents a significant reduction in transistor count from earlier latch designs. The FIG. 2 latch, including the identified eight latching transistors, accomplishes both inversion and latching functions without adding any significant domino circuit propagation delay to the data path, which includes the latch output node 234 of the domino circuit. The circuitry combined with the latching transistors is comprises scanning and test circuitry which is illustrated to show the combination of scanning circuitry with the latching circuitry in order to include a scanning capability without affecting the domino data path or domino signal propagation timing.

Figure 3:
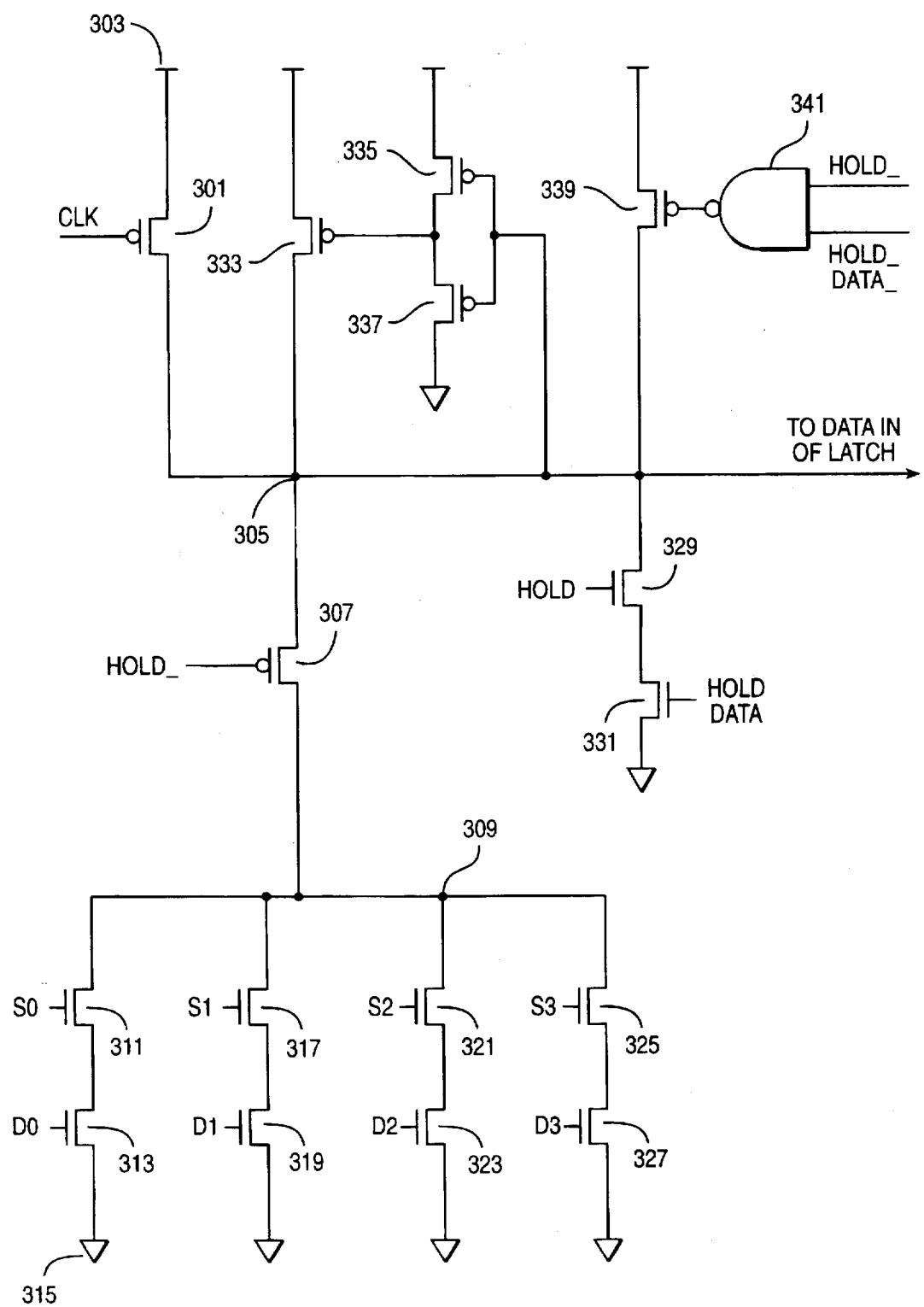
FIG. 3 is a circuit diagram of a 4:1 MUX circuit including a priority hold feature.

FIG. 3 illustrates a MUX circuit with a priority "hold" feature. A MUX circuit includes four input selects and four input data signals and provides a MUX output signal to a MUX output node 309. A first data input signal D0 and a first input select signal S0 are applied to the gate terminals of transistors 311 and 313 which are connected in series between the 0 logic level 315 and the MUX output node 309. In a similar manner, second, third and fourth data select signals S1, S2, and S3, respectively, and second, third and fourth data input signals D1, D2 and D3, respectively, are applied to corresponding gate terminals of three series connected two-transistor sets of n-channel transistors 317 and 319, 321 and 323 and 325 and 327, respectively.

N-channel transistor 307 is connected between the MUX output node 309 and a priority hold output node 305. The priority hold node 305 is arranged to provide and output signal on the DATA IN line of a latch circuit. The gate terminal of transistor 307 is arranged to receive a "HOLD_" signal. A p-channel transistor 301 is connected between the logic 1 level 303 and the priority hold node 305. The gate terminal of transistor 303 is arranged to receive a clock signal CLK. The priority hold node 305 is also connected to ground through two series connected n-channel transistors 229 and 231. The gate terminal of transistor 329 is arranged to receive a HOLD signal and the gate terminal of transistor 331 is arranged to receive a HOLD DATA signal.

NAND gate 341 is arranged to receive signals HOLD_ and HOLD_$_{DATA\_}$. The output of the NAND gate 341 is connected to a gate terminal of a p-channel transistor 339. The output terminals of transistor 339 connect the logic 1 potential to the priority hold node 305. A p-channel transistor 335 and an n-channel transistor 337 are connected in series between the logic 1 potential and the logic 0 potential, respectively. The gate terminals of transistors 335 and 337 are connected together and to the priority hold node 305. A common point between the output terminals of transistors 335 and 337 is connected to the gate terminal of a p-channel transistor 333. Transistor 333 is connected between the logic 1 potential and the priority hold node 305.

In operation, a hold feature and implementing structure have been added to the MUX/latch domino block shown in FIG. 2. When the HOLD signal is activated or goes high, the latch will continue to hold the value in the latch for the corresponding cycle and subsequent cycles as long as HOLD is maintained active. In the present example, if HOLD is not activated, the MUX and Latch functions will operate in a normal manner as hereinbefore explained. The HOLD function is useful in many processing situations such as in connection with circuit queuing functions and pipeline holding requirements for timing and processing synchronization.

Figure 4:
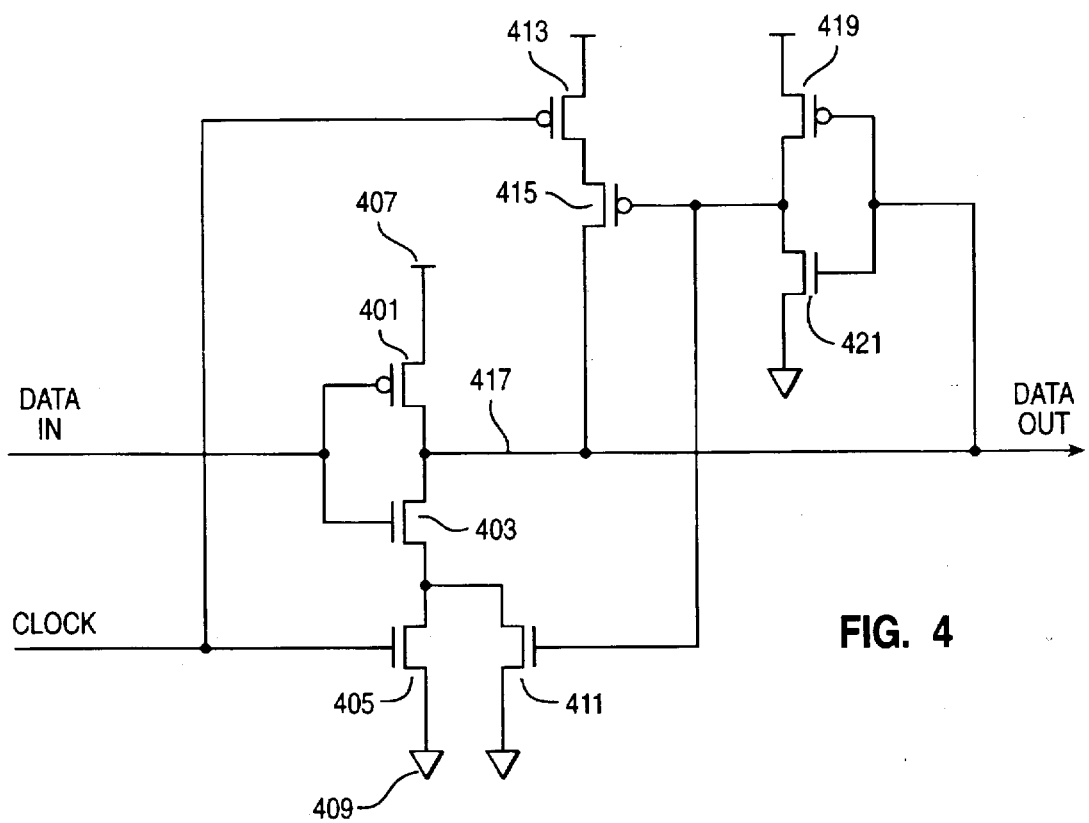
FIG. 4 is a circuit diagram of a latch circuit used in the domino blocks of the present example.

In FIG. 4, the minimal component eight transistor latch is shown by itself without the merged domino block. A p-channel transistor 401, and two n-channel transistors 403 and 405 are serially connected between a "1" logic level potential 407 and ground or a "0" logic level potential 409. The gate terminals of transistors 401 and 403 are connected together and arranged to receive a DATA IN input signal. The gate terminal of transistor 405 is arranged to receive a CLOCK input signal. An n-channel transistor 411 connects a common point between the output terminals of transistors 403 and 405 to ground. Two p-channel transistors 413 and 415 are serially connected between a logic 1 level potential and a latch output node 417. The gate terminal of transistor 413 is connected to the gate terminal of transistor 405 and also receives the CLOCK input signal. The gate terminal of transistor 415 is connected to the gate terminal of transistor 411. P-channel transistor 419 and n-channel transistor 421 are connected in series between the 1 logic potential and ground. A common point between the output terminals of transistors 419 and 421 is connected to the gate terminal of transistor 415. The gate terminals of transistors 419 and 421 are connected together and to the latch output node 417 which provides the output signal DATA OUT.

Figure 5:
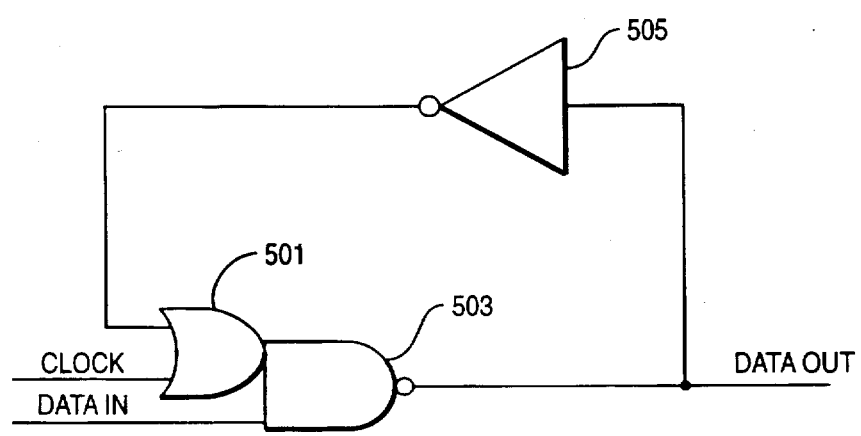
FIG. 5 is a gate level drawing of the circuit shown in FIG. 4.

FIG. 5 shows the gate level logic equivalent of the circuit shown in FIG. 4. Transistors 405, 411, 413 and 415 comprise the OR gate 501 while transistors 401 and 403 together make up the NAND gate 503. Transistors 419 and 421 comprise the inverter circuit 505.

Through the exemplary method and implementation described herein for domino block design, there has been provided a new domino circuit block including a minimal component latch circuit which accomplishes domino circuit inversion and latching functions with only substantially one gate delay presented in the domino data line. The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A domino circuit comprising:

(a) a logic function circuit segment, said logic function circuit segment being selectively operable to provide a logic output signal in response to a selected input signal;

(b) a domino output latch segment connected to said logic function circuit segment, the domino output latch segment being arranged to receive said logic output signal and provide a data output signal from said domino circuit, said domino output latch segment being operable to apply both inverting and latching functions to said logic output signal in providing said data output signal from said domino circuit; and (c) holding circuitry coupled to said logic function circuit segment and said domino output latch segment, said holding circuitry being selectively operable to impose a hold state within said domino circuit whereby a value of the data output signal is maintained over a period of time in accordance with an independently generated HOLD signal.

2. The domino circuit as set forth in claim 1 wherein said logic function circuit segment comprises a MUX circuit.

3. The domino circuit as set forth in claim 1 further comprising:

(a) scanning circuitry coupled to said output latch segment, said scanning circuitry being selectively operable for scan testing said domino circuit.

4. The domino circuit as set forth in claim 1, wherein the domino output latch segment comprises:

(a) a first transistor connected between a first logic voltage level bus and an output node;

(b) a second transistor connected between said output node and a first common point, said first and second transistors being arranged for receiving said logic output signal from the logic function circuit segment;

(c) a third transistor connected between said first common point and a second logic voltage level bus, and being arranged for receiving a timing clock signal;

(d) a fourth transistor connected between said first common point and said second logic voltage level bus;

(e) a fifth transistor and a sixth transistor, said fifth transistor being arranged for connection between the first logic voltage level bus and said sixth transistor, said sixth transistor being connected to said output node, said fifth transistor having an input terminal connected to an input terminal of said third transistor for receiving said clock signal, said sixth transistor having an input terminal connected to an input terminal of said fourth transistor; and (f) a seventh transistor and an eighth transistor, said seventh and eighth transistors being serially connected between the first logic voltage level bus and the second logic voltage level bus, said input terminal of said sixth transistor being connected to a common point connecting said seventh and eighth transistors, said seventh and eighth transistors having input terminals thereof connected together to the output node.

5. A domino circuit comprising:

(a) a logic function circuit segment, said logic function circuit segment being selectively operable to provide a logic output signal in response to an input signal;

(b) a domino output latch segment connected to said logic function circuit segment within said domino circuit, said domino output latch segment being arranged to receive said logic output signal and provide a data output signal from said domino circuit, said domino output latch segment being operable to apply both inverting and latching functions to said logic output signal in providing said data output signal from said domino circuit; and (c) scanning circuitry coupled to the domino output latch segment, said scanning circuitry for providing a scan output in response to a scan input signal and a first and second pair of complementary clock signals.

6. The domino circuit as set forth in claim 5 wherein the scanning circuitry is coupled to the domino latch circuit segment at points removed from an output node on which the data output signal is applied.

7. The domino circuit as set forth in claim 5, wherein the domino output latch segment comprises:

(a) a first transistor connected between a first logic voltage level bus and an output node;

(b) a second transistor connected between said output node and a first common point, said first and second transistors being arranged for receiving said logic output signal from the logic function circuit segment;

(c) a third transistor connected between said first common point and a second logic voltage level bus, and being arranged for receiving a timing clock signal;

(d) a fourth transistor connected between said first common point and said second logic voltage level bus;

(e) a fifth transistor and a sixth transistor, said fifth transistor being arranged for connection between the first logic voltage level bus and said sixth transistor, said sixth transistor being connected to said output node, said fifth transistor having an input terminal connected to an input terminal of said third transistor for receiving said clock signal, said sixth transistor having an input terminal connected to an input terminal of said fourth transistor; and (f) a seventh transistor and an eighth transistor, said seventh and eighth transistors being serially connected between the first logic voltage level bus and the second logic voltage level bus, said input terminal of said sixth transistor being connected to a common point connecting said seventh and eighth transistors, said seventh and eighth transistors having input terminals thereof connected together to the output node.

* * * * *